(12) United States Patent
Tada

(10) Patent No.: US 7,504,909 B2
(45) Date of Patent: Mar. 17, 2009

(54) MEMS TYPE OSCILLATOR, PROCESS FOR FABRICATING THE SAME, FILTER, AND COMMUNICATION UNIT

(75) Inventor: Masahiro Tada, Kanagawa (JP)

(73) Assignee: Sony Corporation, Tokyo (JP)

( * ) Notice: Subject to any disclaimer, the term of this patent is extended or adjusted under 35 U.S.C. 154(b) by 60 days.

(21) Appl. No.: 10/561,715

(22) PCT Filed: Jul. 2, 2004

(86) PCT No.: PCT/JP2004/009758

§ 371 (c)(1),
(2), (4) Date: Dec. 21, 2005

(87) PCT Pub. No.: WO2005/004326

PCT Pub. Date: Jan. 13, 2005

(65) Prior Publication Data

US 2007/0052497 A1 Mar. 8, 2007

(30) Foreign Application Priority Data

Jul. 2, 2003 (JP) ............... 2003-190642

(51) Int. Cl.
*H03H 9/00* (2006.01)
(52) U.S. Cl. .................... 333/186; 29/25.35
(58) Field of Classification Search ............. 333/186, 333/197; 310/309; 216/2; 438/50, 51
See application file for complete search history.

(56) References Cited

U.S. PATENT DOCUMENTS 3,634,787 A * 1/1972 Newell ................ 333/186

6,429,755 B2 * 8/2002 Speidell et al. ............. 333/197

FOREIGN PATENT DOCUMENTS

| JP | 64-68114 | 3/1989 |
| JP | 2001-308677 | 11/2001 |
| JP | 2002-535865 | 10/2002 |

OTHER PUBLICATIONS

C. T. -C. Nguyen, "Design and Performance of CMOS Micromechanical Resonator Oscillators", 1994 IEEE International Frequency Control Symposium, Jun. 1, 1994, pp. 127-134.*
Clark T.-C. Nguyen, et al., "Design and Performance of CMOS Micromechanical Resonator Oscillators", Proceedings of the 1994 IEEE International Frequency Control Symposium, 1994, 48th., pp. 127-134, Fig. 3.

* cited by examiner

*Primary Examiner*—Benny Lee
*Assistant Examiner*—Eric R Hamill
(74) *Attorney, Agent, or Firm*—Sonnenschein Nath & Rosenthal LLP

(57) ABSTRACT

A MEMS resonator, a method for manufacturing thereof, and a filter are provided in which a first-order oscillation mode can be used and an S/N ratio of an output signal can be improved. Further, a communication apparatus of high reliability using the filter is provided.

A MEMS resonator of the present invention includes an output electrode, a beam capable of oscillating disposed on an input side to face the output electrode and an input electrode, in which the output electrode and the input electrode 27 are separated from the beam in terms of DC. A filter of the present invention includes the above-described MEMS resonator. A communication apparatus of the present invention includes a filter to limit a band of a transmission signal and/or reception signal, and the above-described filter according to the present invention is used as the filter.

10 Claims, 12 Drawing Sheets

MEMS TYPE OSCILLATOR, PROCESS FOR FABRICATING THE SAME, FILTER, AND COMMUNICATION UNIT

TECHNICAL FIELD

The present invention relates to a MEMS resonator, a method for manufacturing thereof, and a filter including the MEMS resonator.

Further, the present invention relates to a communication apparatus including such filter.

BACKGROUND ART

In recent years, attention has been paid to a micro-machine (MEMS: Micro Electro Mechanical Systems) element and a small device in which a MEMS element is incorporated. A basic characteristic of the MEMS element is that a driving body included as a mechanical structure is incorporated into a part of the element, and the driving body is driven electrically by an application of coulomb's force between electrodes and the like.

On the other hand, since a micro-oscillation element formed by using a micro-machining technology based on a semiconductor process has such advantages that an area occupied by a device is small, a high Q-value can be obtained, and an integration with another semiconductor device is possible, a use as a high frequency filter in wireless communication devices has been proposed by research laboratories including Michigan University (refer to Non-patent Reference 1).

FIG. 10 shows a schematic view of a resonator, specifically a MEMS resonator, constituting a high frequency filter described. This resonator 1 includes a fixed output electrode 4 formed on a semiconductor substrate 2 through an insulation film 3 and a beam 6 capable of oscillating is formed on an input side to face the output electrode 4 separated by a space 5. The beam 6 has conductivity and is disposed to straddle the output electrode 4 like a bridge to be supported by anchor portions (support portions) 8 [8A, 8B] on both the ends.

In this resonator 1, an input terminal t1 is led out from an input electrode 7 connected to an extension portion from the anchor portion 8A of the beam 6, for example, and an output terminal t2 is led out from the output electrode 4, respectively.

In this resonator 1, a high frequency signal S1 is supplied to the beam 6 through the input terminal t1 in the state where a DC bias voltage V1 is applied between the output electrode 4 and the beam 6, and the beam 6 oscillates by electrostatic power generated between the output electrode 4 and the beam 6. A product of a temporal change of capacitance between the output electrode 4 and the beam 6 caused by the oscillation and the DC voltage is output from the output electrode through the output terminal t2. A signal that corresponds to a natural oscillation frequency (resonant frequency) of the beam is output in a high frequency filter.

FIG. 11 is a simulation of a beam structure of the above-described MEMS resonator 1. Portions corresponding to those in FIG. 10 are shown by giving the same reference numerals. A resonant frequency fR of the beam 6 is expressed by a numerical formula 1. In order to obtain a high frequency in the resonator 1, it is necessary to reduce a length L of the beam.

$$fR = \frac{0.162h}{L^2}\sqrt{\frac{EK}{\rho}}$$ [Numerical Formula 1]

L: length of beam (resonator structure)
h: thickness of beam (resonator structure)
E: Young's modulus
K: electromagnetic coupling coefficient
ρ: film density

[Non-patent Reference 1] C. T. -C. Nguyen, "Micromechanical components for miniaturized low-power communication (invited plenary)", proceedings, 1999 IEEE MTT-S International Microwave Symposium RF MEMS Workshop, Jun. 18, 1999, pp, 48-77.

FIG. 12 shows an equivalent circuit of the above-described MEMS resonator 1. However, a beam is of a cantilever beam type in this MEMS resonator. In this MEMS resonator 1, between the input terminal t1 and the output terminal t2 are inserted in parallel a series circuit of resistance Rx, inductance Lx, and capacitance Cx that constitutes a resonance system, and parasitic capacitance C0 by the space 5 between the beam 6 that is the input electrode and the output electrode 4. When impedance of the resonance system is Zx and impedance of the parasitic capacitance C0 is Z0, an S/N ratio of an output signal is equivalent to Z0/Zx. When a value of Z0/Zx becomes smaller than 1.0, the S/N ratio of the output signal becomes small, because a high frequency signal is transmitted through the impedance Z0 of the parasitic capacitance C0. In the above-described MEMS resonator 1, since the capacitance C0 between the beam 6 and the output electrode 4 before the application of the bias is large, the S/N ratio may be deteriorated.

FIG. 7 is a graph according to a simulation showing a relation between a frequency and Z0/Zx in the resonator. A straight line a with ●-marks being plotted is a characteristic of the above-described resonator 1. The lower the frequency is, the larger the value of Z0/Zx becomes, and when the frequency becomes high and Z0/Zx becomes smaller than 1.0, the resonator 1 does not function as a resonator.

On the other hand, the applicants of the present invention have previously proposed a MEMS resonator in which a large S/N ratio of an output signal is obtained by controlling capacitance C0 between a beam and an output. FIG. 9 shows an example of the MEMS resonator. This MEMS resonator 11 includes: an input electrode 14 into which a high frequency signal S2 is input and an output electrode 15 to output a high frequency signal, which are disposed at a required interval on a semiconductor substrate 12 through an insulation film 13, and a beam capable of oscillating (what is called an oscillation electrode) 17 disposed to face those input and output electrodes 14 and 15 separated by a space 16. The beam 17 is supported by anchor portions (support portions) 18 (18A, 18B) at both ends, and is made into a both-ends-supported beam structure.

In this MEMS resonator 11, a high frequency signal S2 is input into the input electrode 14 through an input terminal t1, a required DC bias voltage V2 is applied to the beam 17, and a high frequency signal of an objective frequency is output from an output terminal t2 which is led out from the output electrode 15. According to this MEMS resonator 11, since facing areas of the input and output electrodes 14 and 15 can be small and an interval between the input and output electrodes 14 and 15 can be large, the parasitic capacitance C0 between the input and output electrodes 14 and 15 becomes small. In addition, in order to obtain a large output signal, the space 16 between the beam 17 and the input and output electrodes 14 and 15 can be made small. Accordingly, the S/N ratio of the output signal can be improved in comparison to the MEMS resonator 1 of the related art shown in FIG. 10.

Hereupon, an oscillation of a second-order mode or higher is used in this MEMS resonator 11. Therefore, when measuring a characteristic of the resonator 11, specifically, when measuring a characteristic ranging from a low frequency to a high frequency, since oscillation may be caused in a first-order mode in a low frequency, there is a possibility that the beam 17 is brought in contact with a lower electrode (input electrode 14, output electrode 15). In other words, since amplitude of the beam 17 becomes larger in the oscillation of the first-order mode than in the oscillation of the second-order mode, there is a possibility that the beam 17 is brought in contact with the lower electrode. If the beam 17 is in contact with the lower electrode, spike current flows in the input electrode 14 and there is a possibility of damaging a peripheral device.

DISCLOSURE OF THE INVENTION

In view of the above, the present invention provides a MEMS resonator, a method for manufacturing thereof, and a filter, in which a first-order oscillation mode can be used and an S/N ratio of an output signal can be improved.

Further, the present invention provided a communication apparatus including the filter.

A first MEMS resonator according to the present invention has an output electrode, a beam capable of oscillating disposed on an input side to face the output electrode, and an input electrode, in which the output electrode and input electrode are separated from the beam in terms of DC.

In the first MEMS resonator according to the present invention, since the beam capable of oscillating is disposed on the input side to face the output electrode, a first-order oscillation mode can be used. Since an oscillation of a higher-order oscillation mode has amplitude smaller than the first-order oscillation mode, there is no possibility that the beam is in contact with the output electrode. Since the output electrode and input electrode are separated from the beam in terms of DC, parasitic capacitance between the input and output electrodes becomes a sum of capacitance C01 between the input electrode and the beam and capacitance C02 between the beam and the output electrode, which is small. An anti-resonance peak of the resonator can be altered by changing a film thickness and/or area of an insulation film (dielectric film) positioned between the input electrode and the beam.

A second MEMS resonator according to the present invention has an output electrode, a beam capable of oscillating disposed on an input side to face the output electrode, and an input electrode, in which the input electrode is connected to the beam through a dielectric film and a required DC voltage is applied to the beam.

In this second MEMS resonator, the beam and extension portions extending from the beam are integrally formed into a flat-plate shape and the beam is supported at the extension portions.

In the second MEMS resonator according to the present invention, since the beam capable of oscillating is disposed on the input side to face the output electrode, a first-order oscillation mode can be used. Since an oscillation of a higher-order oscillation mode has amplitude smaller than the first-order oscillation mode, there is no possibility that the beam is in contact with the output electrode. Since the input electrode is connected to the beam through the dielectric film, the input electrode and output electrode are separated from the beam in terms of DC, and parasitic capacitance between the input and output electrodes becomes a sum of the capacitance C01 between the input electrode and the beam through the dielectric film and the capacitance C02 between the beam and the output electrode, which is small. An anti-resonance peak of the resonator can be altered by changing a film thickness and/or area of the dielectric film. Particularly, since the film thickness can be changed in a process, the anti-resonance peak can easily be adjusted by changing the film thickness.

A first filter according to the present invention includes a MEMS resonator which has an output electrode, a beam capable of oscillating disposed on an input side to face the output electrode, and an input electrode, in which the output electrode and input electrode are separated from the beam in terms of DC.

In the first filter according to the present invention, since in the MEMS resonator to be used is disposed the beam capable of oscillating on the input side to face the output electrode, a first-order oscillation mode can be used. Since an oscillation of a higher-order oscillation mode has amplitude smaller than the first-order oscillation mode, there is no possibility that the beam is in contact with the output electrode. Since the output electrode and input electrode are separated from the beam in terms of DC, parasitic capacitance between the input and output electrodes becomes a sum of the capacitance C01 between the input electrode and the beam and the capacitance C02 between the beam and the output electrode, which is small. An anti-resonance peak of the resonator can be altered by changing a film thickness and/or area of the insulation film (dielectric film) interposed between the input electrode and the beam. In this case, the anti-resonance peak can also be adjusted easily by changing the film thickness on the process.

A second filter according to the present invention includes a MEMS resonator which has an output electrode, a beam capable of oscillating disposed on an input side to face the output electrode, and an input electrode, in which the input electrode is connected to the beam through a dielectric film and a required DC voltage is applied to the beam.

In this second filter, the beam and extension portions extending from the beam are integrally formed into a flat-plate shape and the beam is supported at the extension portions.

In the second filter according to the present invention, since in the MEMS resonator to be used is disposed the beam capable of oscillating on the input side to face the output electrode, a first-order oscillation mode can be used. Since an oscillation of a higher-order oscillation mode has amplitude smaller than the first-order oscillation mode, there is no possibility that the beam is in contact with the output electrode. Since the input electrode is connected to the beam through the dielectric film, the input electrode and output electrode are separated from the beam in terms of DC, and parasitic capacitance between the input and output electrodes becomes a sum of the capacitance C01 between the input electrode and the beam through the dielectric film and the capacitance C02 between the beam and the output electrode, which is small. An anti-resonance peak of the resonator can be altered by changing a film thickness and/or area of the dielectric film. Particularly, since the film thickness can be changed in a process, the anti-resonance peak can easily be adjusted by changing the film thickness. In this case, the anti-resonance peak can also be adjusted easily by changing the film thickness on the process.

A method of manufacturing a MEMS resonator according to the present invention includes the steps of: forming an input-side beam capable of oscillating above an output electrode formed on a substrate through a sacrifice layer and forming a dielectric film on one fixed end of the beam; selectively removing the sacrifice layer; and forming an Al-based input electrode on the dielectric film.

In the method of manufacturing the MEMS resonator according to the present invention, since the Al-based input electrode is formed after removing the sacrifice layer, the input electrode of the resonator can be formed simultaneously when forming the Al electrode in a final process in the case where the MEMS resonator is incorporated integrally into an integrated circuit having other semiconductor elements. Since the input electrode is formed on one fixed end of the beam through the dielectric film, a MEMS resonator having a large S/N ratio of an output signal, in which a first-order oscillation mode can be used, is formed.

A first communication apparatus according to the present invention is a communication apparatus including a filter to limit a band of a transmission signal and/or reception signal, and as the filter, a filter includes a MEMS resonator which has an output electrode, a beam capable of oscillating disposed on an input side to face the output electrode, and an input electrode, in which the output electrode and input electrode are separated from the beam in terms of DC.

In the first communication apparatus according to the present invention, since the filter including the above-described MEMS resonator is used as the filter, a first-order oscillation mode can be used, and since an oscillation in a higher-order oscillation mode has amplitude smaller than the first-order oscillation mode, there is no possibility that the beam is in contact with the output electrode. Since the input electrode and output electrode in the filter are separated from the beam in terms of DC, parasitic capacitance between the input and output electrodes becomes a sum of the capacitance $C_{01}$ between the input electrode and the beam and the capacitance $C_{02}$ between the beam and the output electrode, which is small.

A second communication apparatus according to the present invention is a communication apparatus including a filter to limit a band of a transmission signal and/or reception signal, and as the filter, a filter includes a MEMS resonator which has an output electrode, a beam capable of oscillating disposed on an input side to face the output electrode, and an input electrode, in which the input electrode is connected to the beam through a dielectric film and a required DC voltage is applied to the beam.

In this second communication apparatus, as the filter the beam and extension portions extending from the beam are integrally formed into a flat-plate shape and the beam is supported at the extension portions.

In the second communication apparatus according to the present invention, since the filter including the above-described MEMS resonator is used as the filter, a first-order oscillation mode can be used and an oscillation of a higher-order oscillation mode has amplitude smaller than the first-order oscillation mode and so there is no possibility that the beam is in contact with the output electrode. Since the input electrode is connected to the beam through the dielectric film in the filter, the input electrode and output electrode are separated from the beam in terms of DC, and parasite capacitance between the input and output electrodes becomes a sum of the capacitance $C_{01}$ between the input electrode and the beam through the dielectric film and the capacitance $C_{02}$ between the beam and the output electrode, which is small. An anti-resonance peak of the resonator can be altered in the filter by changing a film thickness and/or area of the dielectric film.

As described above, according to the first MEMS resonator of the present invention, the first-order oscillation mode can be used. Since the amplitude of the beam in a higher-order oscillation mode becomes smaller than in the first-order oscillation mode, there is no possibility that the beam is brought in contact with the output electrode when measuring the characteristic of the resonator. Therefore, there is no possibility that a peripheral device is damaged. Since the input electrode and output electrode are separated from the beam in terms of DC and the parasitic capacitance between the input and output electrodes becomes small, the ratio $Z_0/Z_x$ of the impedance $Z_0$ of the parasitic capacitance to the impedance $Z_x$ of the resonance system becomes large, and the S/N ratio of the output signal can be improved. Since the anti-resonance peak of the resonator can be changed depending on the film thickness and/or area of the insulation film (dielectric film) interposed between the input electrode and the beam, the filter can easily be designed when this MEMS resonator is used in the filter. Particularly, when the film thickness is changed, the change can be implemented in a process, and therefore the anti-resonance peak can be adjusted easily.

According to the second MEMS resonator of the present invention, the first-order oscillation mode can be used. Since the amplitude of the beam in a higher-order oscillation mode becomes smaller than in the first-order oscillation mode, there is no possibility that the beam is in contact with the output electrode when measuring the characteristic of the resonator. Therefore, there is no possibility that a peripheral device is damaged. Since the input electrode is connected to the beam through the dielectric material and the parasitic capacitance between the input and output electrodes becomes small, the ratio $Z_0/Z_x$ of the impedance $Z_0$ of the parasitic capacitance to the impedance $Z_x$ of the resonance system becomes large, and the S/N ratio of the output signal can be improved. Since the anti-resonance peak of the resonator can be changed depending on the film thickness and/or area of the dielectric film in the input electrode, the filter can easily be designed when this MEMS resonator is used in the filter. When the film thickness is changed, this change can be implemented in a process and therefore the anti-resonance peak can easily be adjusted. When the MEMS resonator is formed such that the beam and the extension portions extending from this beam are integrally formed into the flat-plate shape and the beam is supported at the extension portions, the oscillation can be made into a high frequency in comparison to a structure in which the beam is supported like a bridge.

According to the first filter of the present invention, since the above-described first MEMS resonator is used, the first-order oscillation mode can be used. Since the amplitude of the beam in a higher-order oscillation mode becomes smaller than in the first-order oscillation mode, there is no possibility that the beam is in contact with the output electrode when measuring the characteristic of the filter. Therefore, there is no possibility that a peripheral device is damaged. Since the input electrode and output electrode are separated from the beam in terms of DC and the parasitic capacitance between the input and output electrodes becomes small, the ratio $Z_0/Z_x$ of the impedance $Z_0$ of the parasitic capacitance to the impedance $Z_x$ of the resonance system becomes large, and the S/N ratio of the output signal can be improved. Since the anti-resonance peak of the resonator can be changed depending on the film thickness and/or area of the insulation film (dielectric film) interposed between the input electrode and the beam, the filter can be designed easily. When the film thickness is changed, this change can be implemented in a process and therefore the anti-resonance peak can be adjusted easily.

According to the second filter of the present invention, since the above-described second MEMS resonator is used, the first-order oscillation mode can be used. Since the amplitude of the beam in a higher-order oscillation mode is smaller than in the first-order oscillation mode, there is no possibility that the beam is in contact with the output electrode when measuring the characteristic of the filter. Therefore, there is no possibility that a peripheral device is damaged. Since the input electrode is connected to the beam through the dielectric material and the parasitic capacitance between the input and output electrodes becomes small, the ratio Z0/Zx of the impedance Z0 of the parasitic capacitance to the impedance Zx of the resonance system becomes large, and the S/N ratio of the output signal can be improved. Since the anti-resonance peak of the resonator can be changed depending on the film thickness and/or area of the dielectric film in the input electrode, the filter can be designed easily. When the film thickness is changed, this change can be implemented in a process and therefore the anti-resonance peak can easily be adjusted. When the MEMS resonator is formed such that the beam and the extension portions extending from this beam are integrally formed into the flat-plate shape and the beam is supported at the extension portions, the oscillation can be made into a high frequency in comparison to a structure in which the beam is supported like a bridge.

According to the method of manufacturing the MEMS resonator of the present invention, a MEMS resonator which uses the first-order oscillation mode and which has an improved S/N ratio of the output signal can be manufactured. Further, an integrated circuit into which the MEMS resonator and other semiconductor elements are integrated can be manufactured.

According to the first and second communication apparatuses of the present invention, since the above-described first and second filters are further included, there is no possibility in the filter that the beam is in contact with the output electrode of the lower electrode when operation is performed, hence, there is no possibility that spike current flows in the input electrode. Accordingly, there is no possibility of damaging a peripheral device by the spike current, and so a highly reliable communication apparatus can be provided.

BEST MODE FOR CARRYING OUT THE INVENTION

Hereinafter, embodiments of the present invention are explained by referring to the accompanied drawings.

Figure 1:
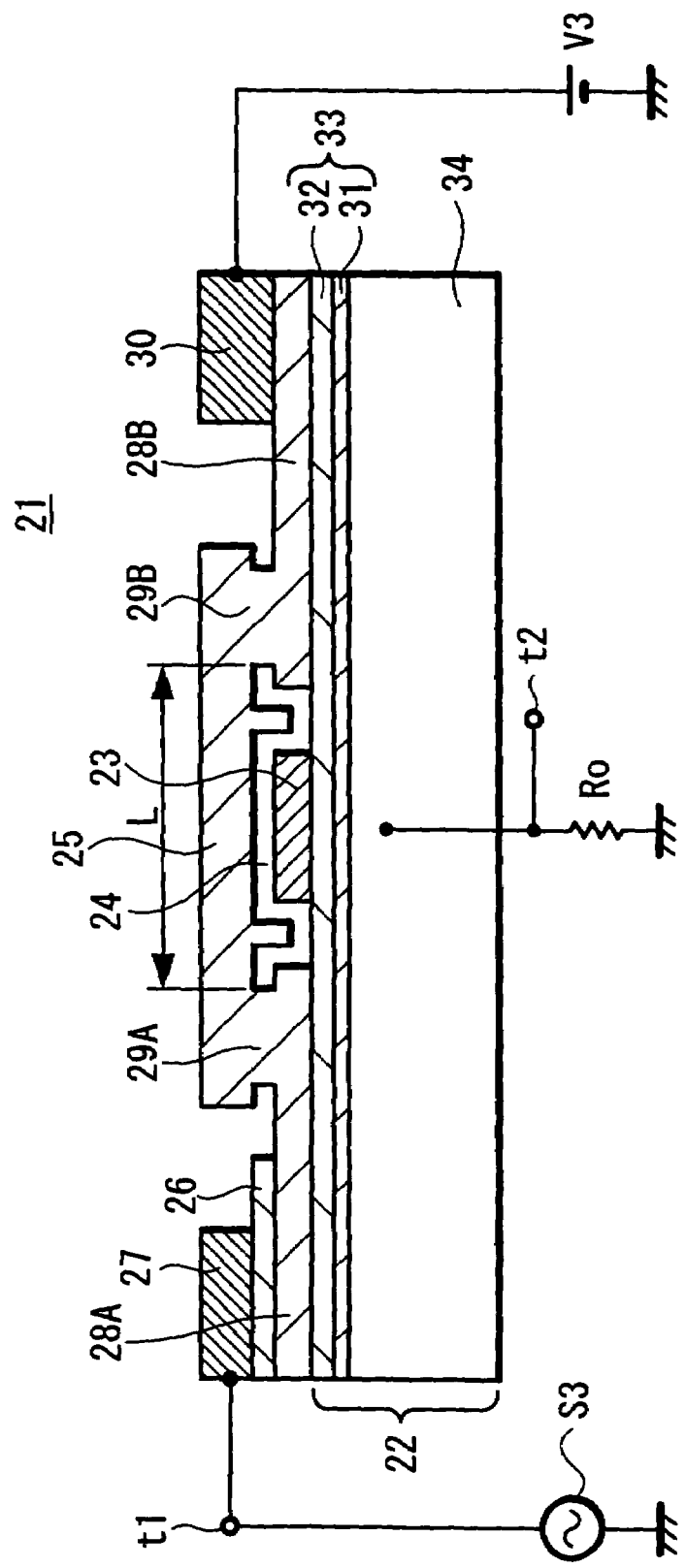
FIG. 1 is a constitutional diagram showing an embodiment of a MEMS resonator according to the present invention.

FIG. 1 shows an embodiment of a MEMS resonator according to the present invention. A MEMS resonator 21 according to this embodiment includes: an output electrode 23 formed on a main surface of a substrate 22, specifically, on a main surface having at least an insulating nature, which becomes a lower electrode to output a high frequency signal; a beam (what is called a oscillation electrode) 25 on an input side facing this output electrode 23 separated by a space 24; and an input electrode 27 connected to the beam 25 through a dielectric film 26. The beam 25 straddles the output electrode 23 like a bridge, and both end portions are integrally supported by anchor portions (what is called support portions) 29 [29A, 29B] such that the beam is connected to a conductive layers 28 [28A, 28B] disposed outside the output electrode 23. The input electrode 27 is disposed on the conductive layer 28A, which is one of the conductive layers, through the dielectric film 26.

An input terminal t1 is led out of the input electrode 27 so that a high frequency signal S3 is input into the input electrode 27 through the input terminal t1. An output terminal t2 is led out of the output electrode 23 so that a high frequency signal of an objective frequency is output from the output terminal t2. R0 is a load resistance. A required direct current (DC) bias voltage V3 is applied to the beam 25 through the anchor portion 29B and a wiring layer 30 on the conductive layer 28B. Specifically, the beam 25 is formed to be separated in terms of DC from the input electrode 27 and output electrode 23.

As the substrate 22, for example, a substrate in which an insulation film is formed on a semiconductor substrate of such as silicon (Si) and gallium arsenide (GaAs), an insulating substrate such as a quartz substrate and a glass substrate, and the like are used. In this example, the substrate 22 in which an insulation film 33 made of a silicon oxide film 31 and silicon nitride film 32 laminated is formed on a silicon substrate 34 is used. The output electrode 23, the beam 25 including the anchor portion 29 and the conductive layer 28 are formed with a conductive material, and can be formed with a polycrystalline silicon film and a metal film such as aluminum (Al), for example. The input electrode 27 and the wiring layer 30 are formed with a conductive material, and can be formed with a polycrystalline silicon film and a metal film such as aluminum (Al), for example. Note that, when this MEMS resonator 21 is mounted on a device integrally made into a CMOS-IC, for example, since aluminum (Al) is used in a final process of manufacturing the IC, it is desirable that the input electrode 27 and wiring layer 30 are formed with an aluminum (Al) film and the other output electrode 23, beam 25 including the anchor portion 29 and conductive layer 28 are formed with a polycrystalline silicon film doped with an impurity, in relation to a later-described sacrifice layer when manufacturing this MEMS resonator. A silicon nitride film (SiN film), for example, can be used as the dielectric film 26.

An operation of the MEMS resonator 21 according to this embodiment is as follows.

The required DC bias voltage V3 is applied to the beam 25. The high frequency signal S3 is input into the input electrode 27 through the input terminal t1, and is further input to the beam 25 through capacitance C01 by the dielectric film 26. Similarly to the above, the beam 25 oscillates by electrostatic force generated between the output electrode 23 and the beam 25, and a signal corresponding to a temporal change of capacitance between the output electrode 23 and the beam 25 caused by the oscillation and the DC voltage is output from the output electrode 23 through the output terminal t2. A signal corresponding to a natural oscillation frequency (resonant frequency) of the beam 25 is output in a high frequency filter.

According to the MEMS resonator 21 of this embodiment, a first-order mode can be used as an oscillation mode. In this resonator 21, with a structure in which the beam 25 is not in contact with the output electrode 23 in the first-order oscillation mode having larger amplitude, there is no possibility that the beam 25 is in contact with the output electrode 23 in a higher-order oscillation mode whose amplitude is smaller than the first-order oscillation mode. Therefore, there is no possibility that spike current flows in the input electrode 27 when measuring a characteristic of the resonator 21, and a possibility of damaging a peripheral device can be avoided.

Figure 7:
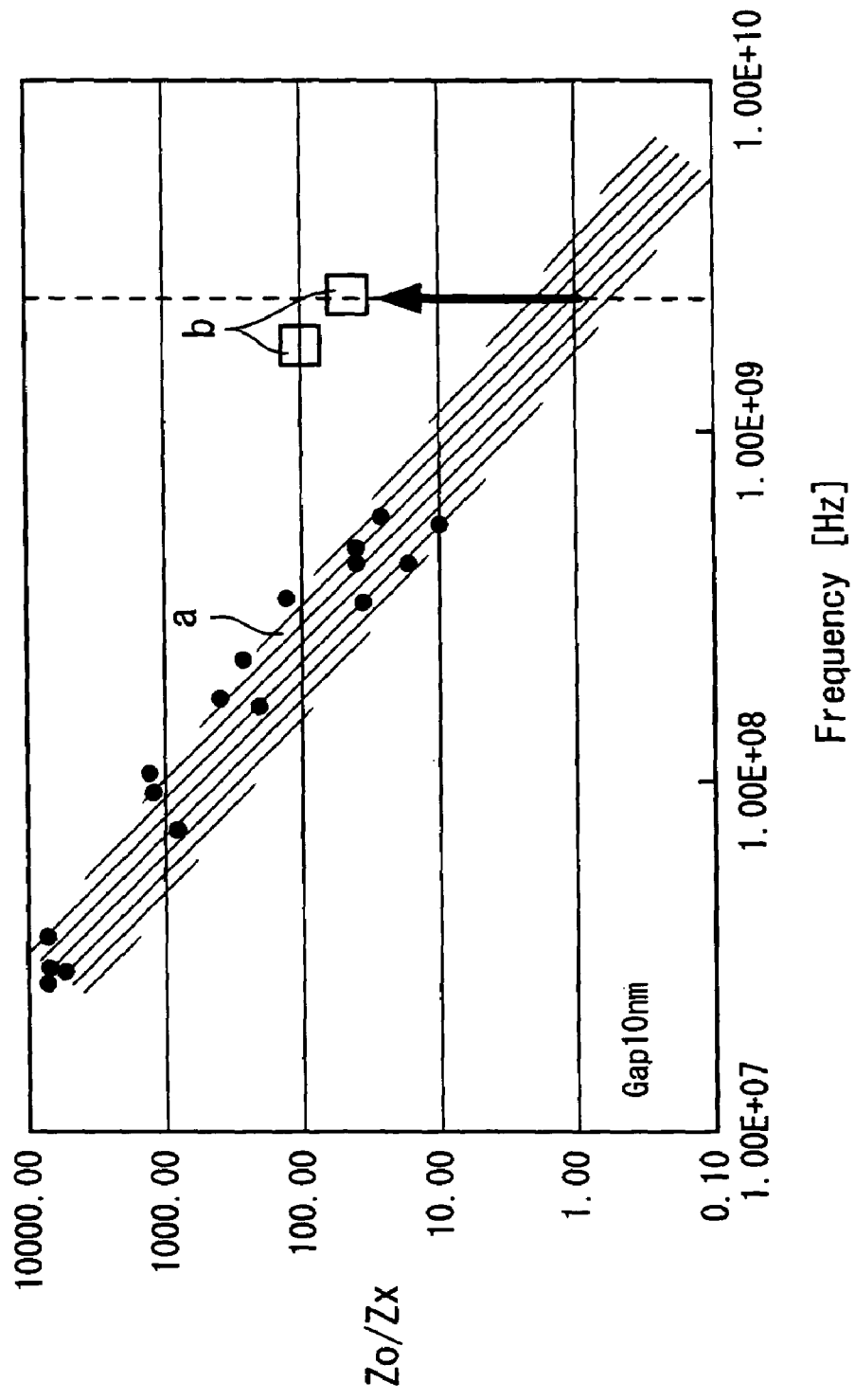
FIG. 7 is a graph based on a simulation in which a Z0/Zx ratio of an example of related art and that of a MEMS resonator of the present invention are compared.
Figure 9:
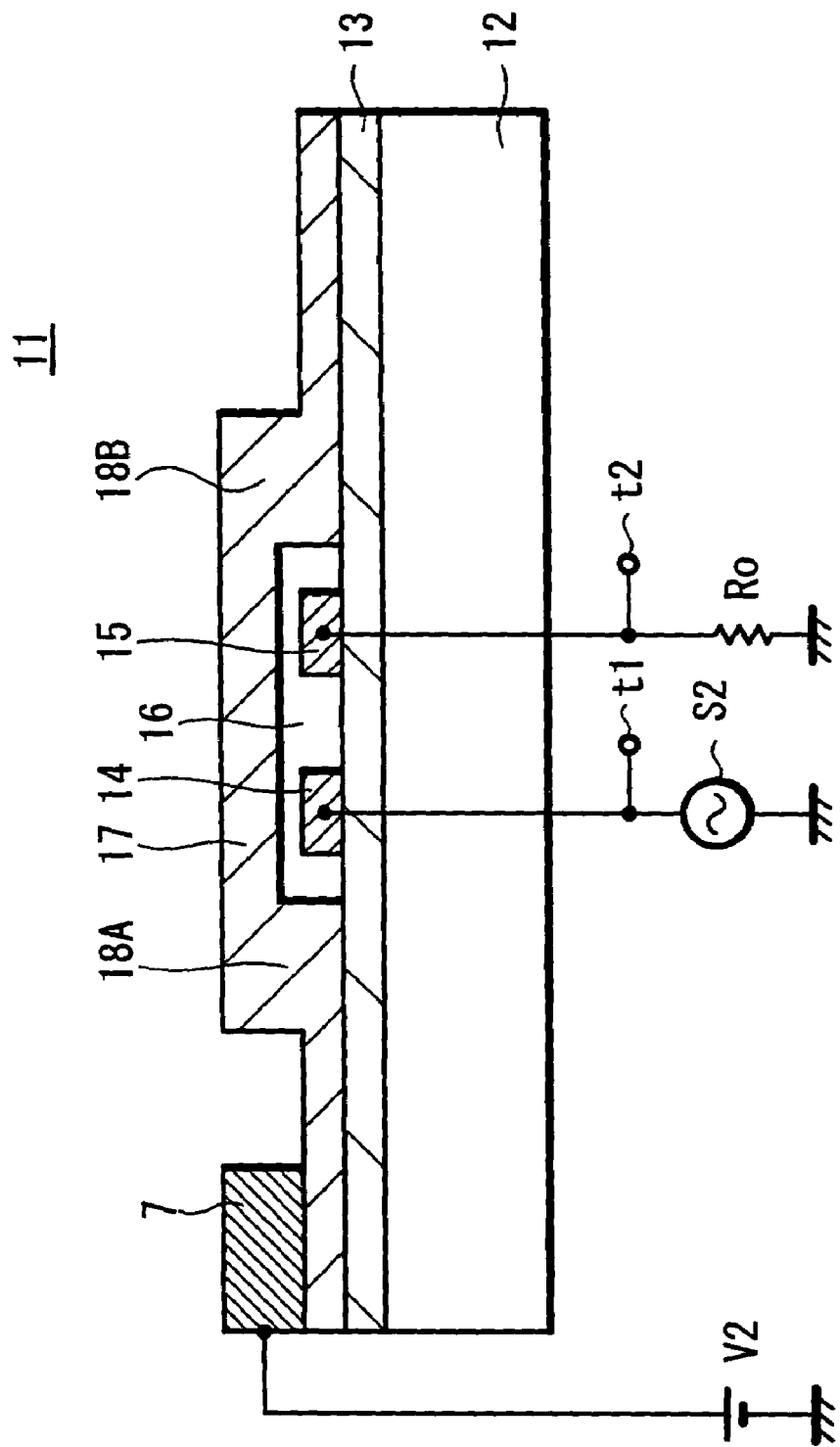
FIG. 9 is a constitutional diagram of a MEMS resonator according to a comparison example.
Figure 10:
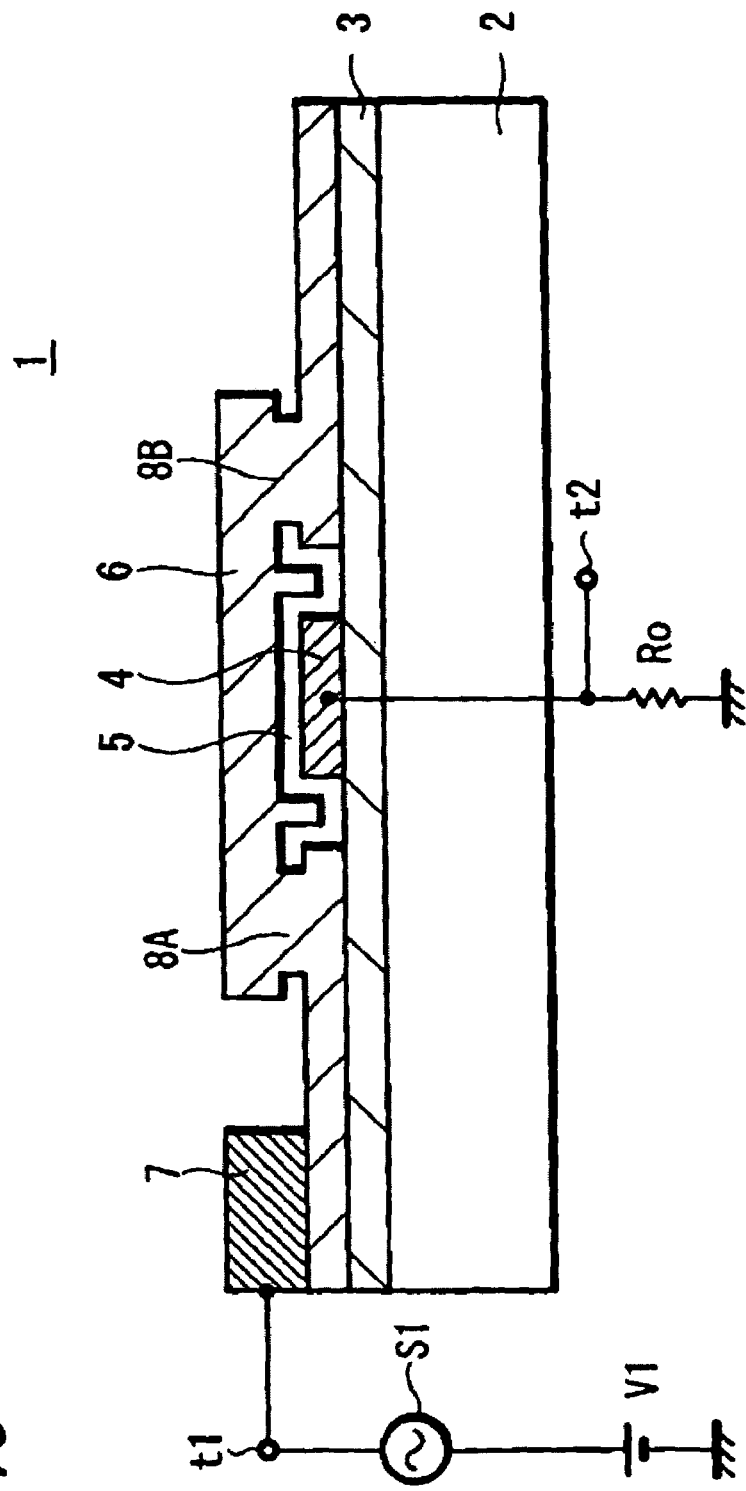
FIG. 10 is a constitutional diagram showing an example of a MEMS resonator in related art.
Figure 11:
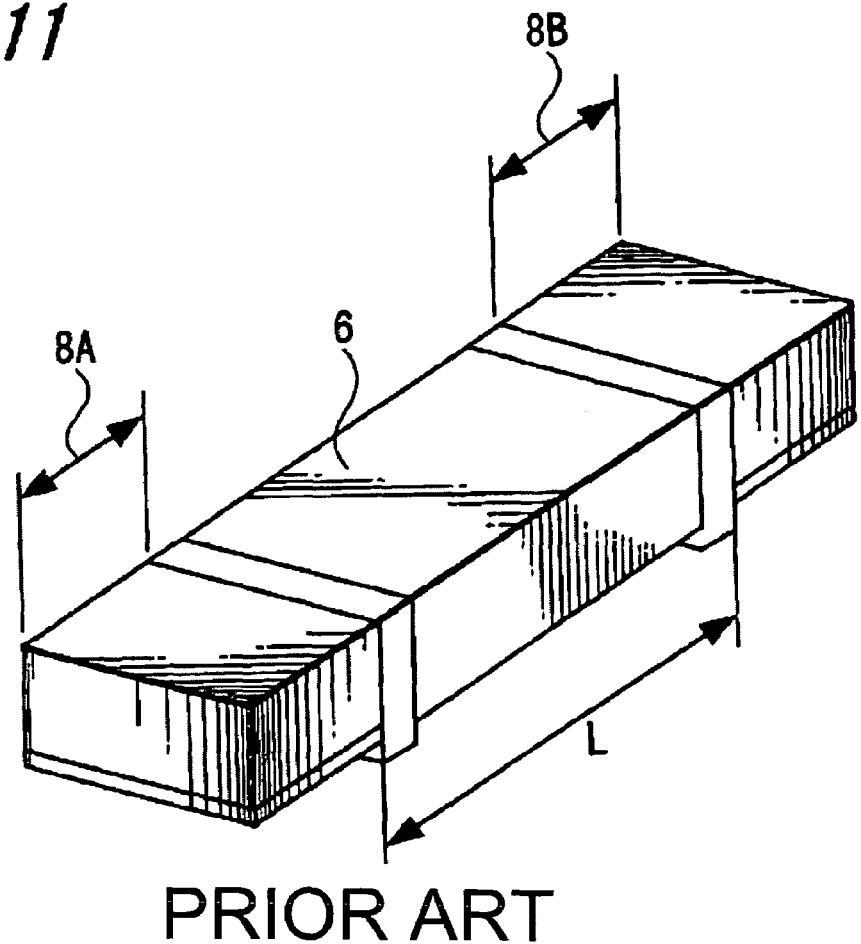
FIG. 11 is a simulation diagram of a beam structure of the MEMS resonator of FIG. 10.
Figure 12:
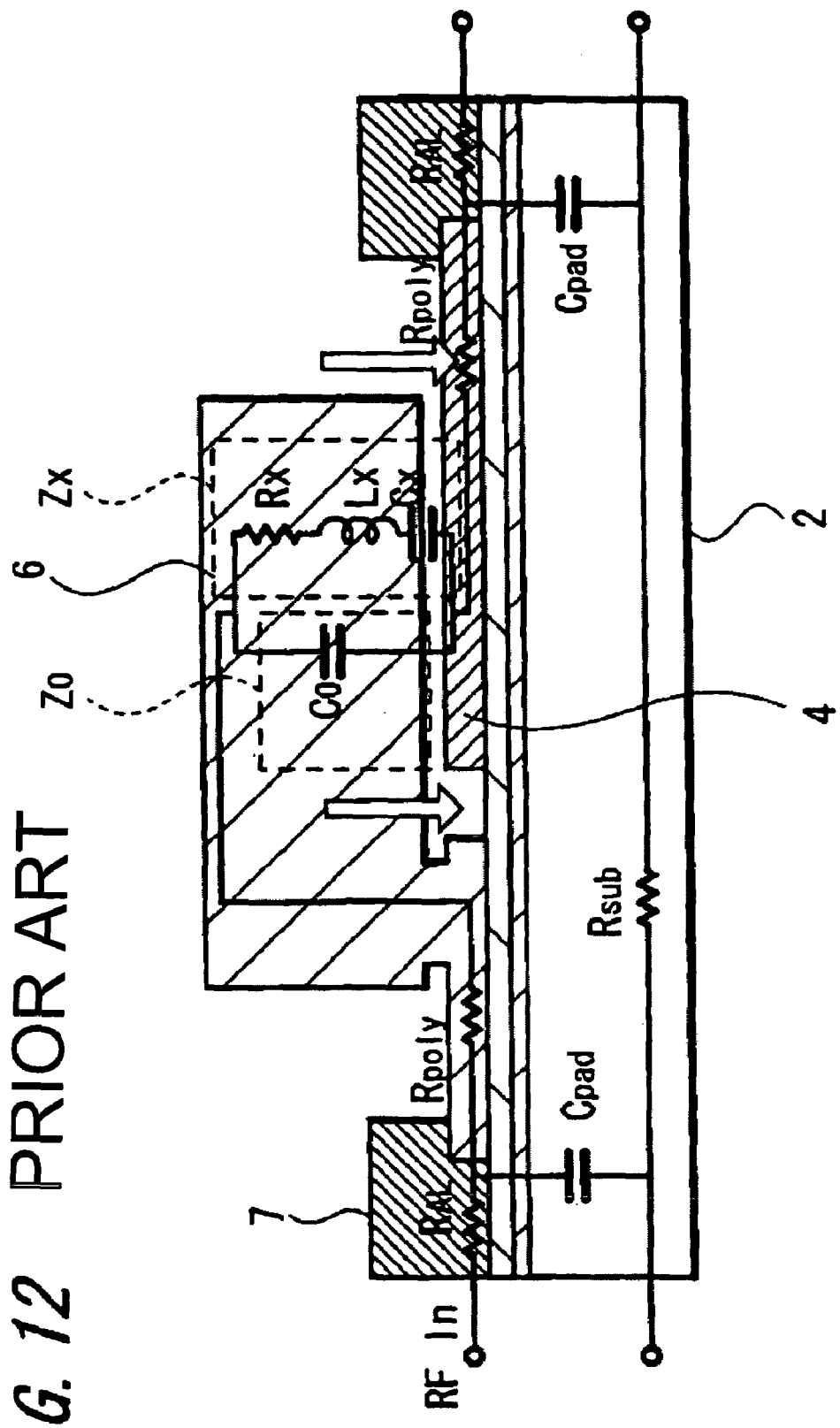
FIG. 12 is an explanatory diagram showing an equivalent circuit of the MEMS resonator in related art.

Since the input electrode 27 is connected to the beam 25 through the dielectric film 26, capacitance $C1=(C01 \times C02)/(C01+C02)$ which is the sum of capacitance C01 in the dielectric film 26 and capacitance C02 between the beam 25 and the output electrode 23 becomes smaller than the capacitance C0 between the input and output electrodes of the resonator 1 in the related art of the above-described FIG. 10 ($C1<C0$). Accordingly, a ratio $(1/C1)/Zx$ of impedance Z0 of parasitic capacitance to impedance Zx of a resonant system becomes large, and so an equivalent S/N ratio of the output signal to that of the resonator 11 of FIG. 9 can be obtained. As shown with a plot b of □-mark in FIG. 7, in the resonator 21 of this embodiment, it is recognized that the ratio improves to be $Z0/Zx=60$ to 100 in a frequency of $Z0/Zx=1.0$ in related art.

In this resonator 21, the capacitance C01 can be altered by changing a film thickness and/or area of the dielectric film 26. Hence, an anti-resonance peak position of the beam 25 can be changed, which enables a filter using the resonator 21 to be designed easily. Specifically, a bandwidth of a filter can be controlled. The larger the capacitance C01 becomes, the larger the bandwidth also becomes.

FIGS. 5A to 5D and 6A to 6D show an embodiment of a method of manufacturing the MEMS resonator 21 according to this embodiment described above.

Figure 5A:
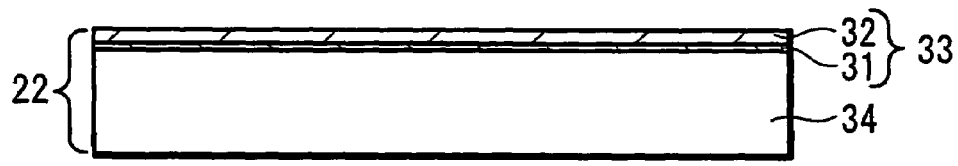
FIGS. 5A through 5D are manufacturing process diagrams (1/2) showing an embodiment of a method of manufacturing a MEMS resonator according to the present invention.

First, as shown in FIG. 5A, the substrate 22 is prepared. In this example, the substrate 22 is prepared in which on a main surface of the silicon substrate 34 are deposited the silicon oxide film ($SiO_2$ film) 31 and the silicon nitride film (SiN film) 33 to be the insulation film 33 by a decompression CVD method.

Figure 5B:
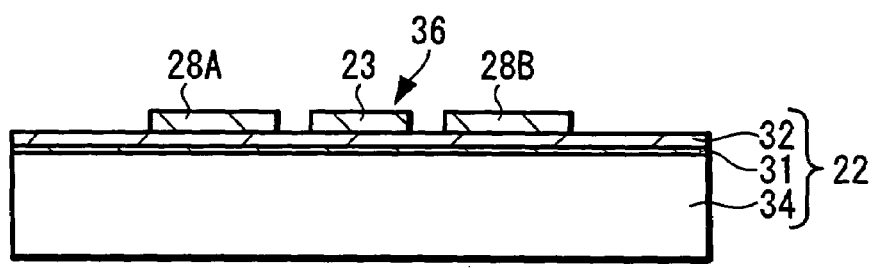

Next, as shown in FIG. 5B, a conductive material layer that is a polycrystalline silicon film 36 of a required thickness containing phosphorus (P) in this example is formed. With patterning the polycrystalline silicon film 36 by means of lithography technology and dry etching technology, the output electrode 23 which is the lower electrode and the conductive layers 28 [28A, 28B] separated by a required distance on the both sides of the output electrode 23 are formed.

Figure 5C:
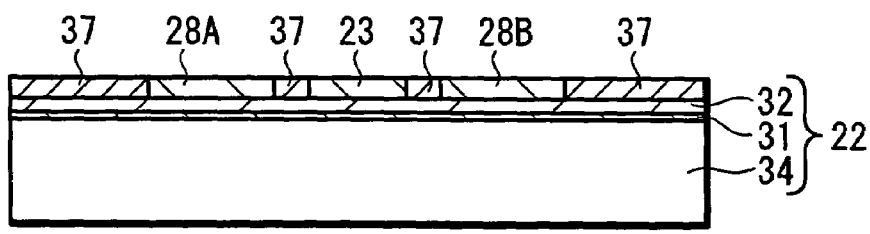

Next, as shown in FIG. 5C, after an insulation film that is a silicon oxide film ($SiO_2$ film) 37 in this example is formed on the whole surface of the substrate 22 by the decompression CVD method, a surface of the silicon oxide film 37 is planarized by using planarization technology to be a single surface with the output electrode 23 and conductive layer 28.

Hence, the silicon oxide film 37 is formed to fill the portion between the output electrode 23 and the conductive layers 28 [28A, 28B].

Figure 5D:
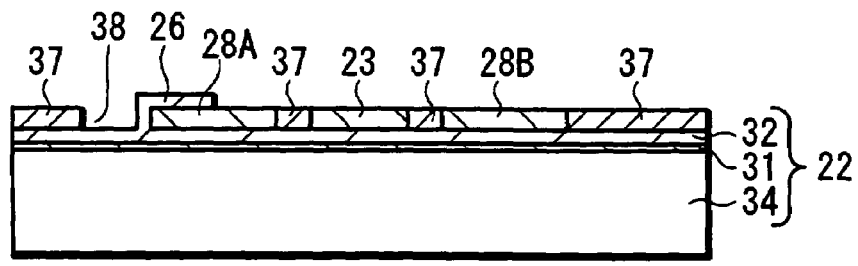

Next, as shown in FIG. 5D, a part of the silicon oxide film 37 in contact with the conductive film 28A on the input electrode side is selectively removed such that an end face of the conductive layer 28A is exposed, and an opening 38 exposing the base silicon nitride film 32 is formed. Subsequently, the dielectric film 26 that is a silicon nitride film in this example is formed on the whole surface including the opening 38 by the decompression CVD method. Thereafter, with patterning the dielectric film 26 into a required pattern by means of the lithography technology and dry etching technology, the dielectric film 26 covering a lateral surface facing the opening 38 of the conductive layer 28A and part of an upper surface is formed.

Figure 6A:
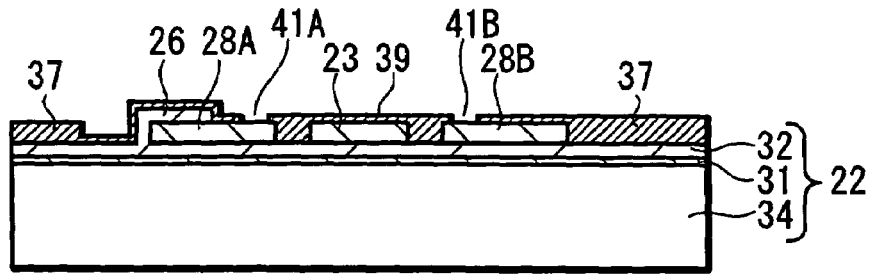
FIGS. 6A through 6D are manufacturing process diagrams (2/2) showing an embodiment of a method of manufacturing a MEMS resonator according to the present invention.

Next, as shown in FIG. 6A, a sacrifice layer 39 is formed on the whole surface including a top of the output electrode 23. In this example, an oxide-film based sacrifice layer is desirable as the sacrifice layer 39, and a silicon oxide film ($SiO_2$ film), for example, is formed by the decompression CVD method. After the sacrifice layer 39 is formed, with patterning the sacrifice layer 39 by means of the lithography technology and dry etching technology, openings 41 [41A, 41B] are formed such that part of the conductive layers 28A and 28B is exposed.

Figure 6B:
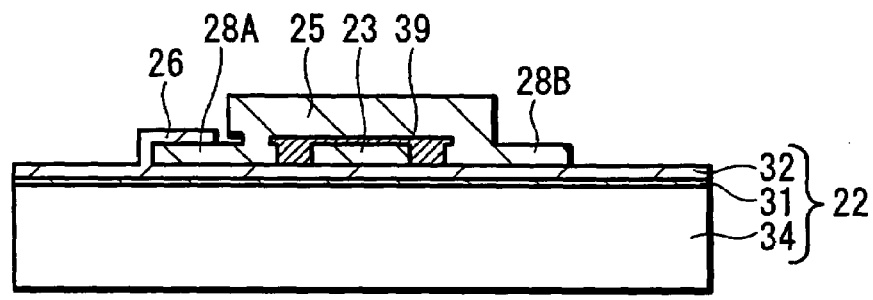

Next, as shown in FIG. 6B, a conductive material layer to form a beam and anchor portion, which is a polycrystalline silicon film containing an impurity in this example, is formed on the whole surface including the inside of the openings 41A and 41B by the decompression CVD method. After that, with patterning the polycrystalline silicon film by means of the lithography technology and dry etching technology, the beam 25 which becomes the oscillation electrode made of the polycrystalline silicon film and the anchor portions 29A and 29B integrated into the both ends thereof are formed. At this time, the anchor portions 29A and 29B are respectively connected to the conductive layers 28A and 28B made of the polycrystalline silicon film through the openings 41A and 41B of the sacrifice layer 39.

Figure 6C:
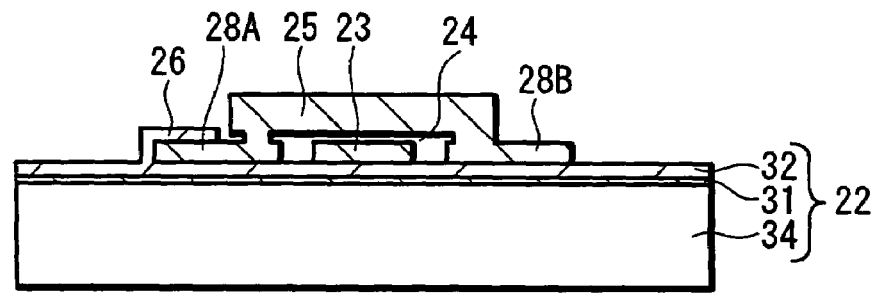

Next, as shown in FIG. 6C, the sacrifice layer 39 is removed. The silicon oxide film 39 that is the sacrifice layer in this example is removed by a solution that can selectively remove a silicon oxide film such as a DHF solution (diluted hydrofluoric acid: $HF+H_2O$), for example. The space 24 is formed between the output electrode 23 and the beam 25 by removing the sacrifice layer 39. The dielectric film 26 that is the base silicon nitride film and the silicon nitride film 32 on the surface of the substrate 22 are exposed by removing the silicon oxide film 39 that is the sacrifice layer.

Figure 6D:
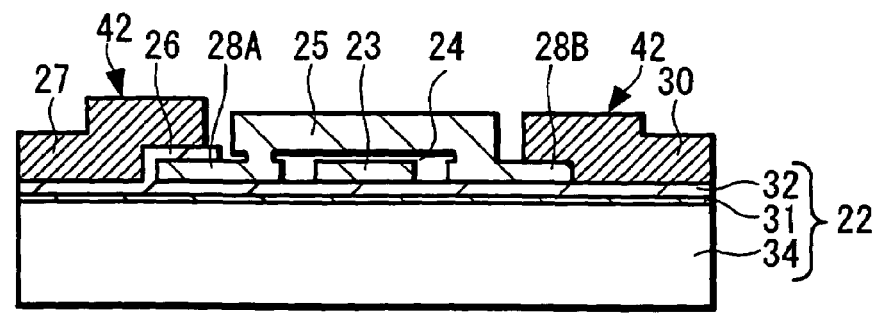

Next, as shown in FIG. 6D, a conductive material layer 42 that becomes an input electrode and wiring layer is formed on the whole surface including a top of the dielectric film 26. In this example, an aluminum (Al) based metal film that is a sputter film of Al—Cu or Al—Si, for example, is formed as the conductive material layer 42. After that, the input electrode 27 made of an aluminum (Al) based film is formed on the dielectric film 26 by patterning the conductive material layer 42 by means of the lithography technology and dry etching technology, and the wiring layer 30 connected to the other conductive layer 28B which is conductive to the beam 25 is formed simultaneously. Thus, the objective MEMS resonator 21 is obtained.

According to the manufacturing method of this embodiment, the objective MEMS resonator 21 can be manufactured with high accuracy. Particularly, in the case where the CMOS-IC is formed on the substrate 22 in common, for example, the objective MEMS resonator can be manufactured excellently with using an Al-based metal film for the input electrode 27 and using an oxide film for the sacrifice layer 39, and with forming the input electrode 27 after the sacrifice layer 39 is removed. Specifically, the silicon oxide film and Al film are materials used in the CMOS-IC, and typically an Al electrode or the like is formed in a final process in the CMOS-IC. Therefore, the CMOS Al electrode and the like can simultaneously be formed without damaging the Al input electrode 27, and since each layer of the resonator 21 can simultaneously be formed in a process of the CMOS, manufacturing can be facilitated.

Figure 2:
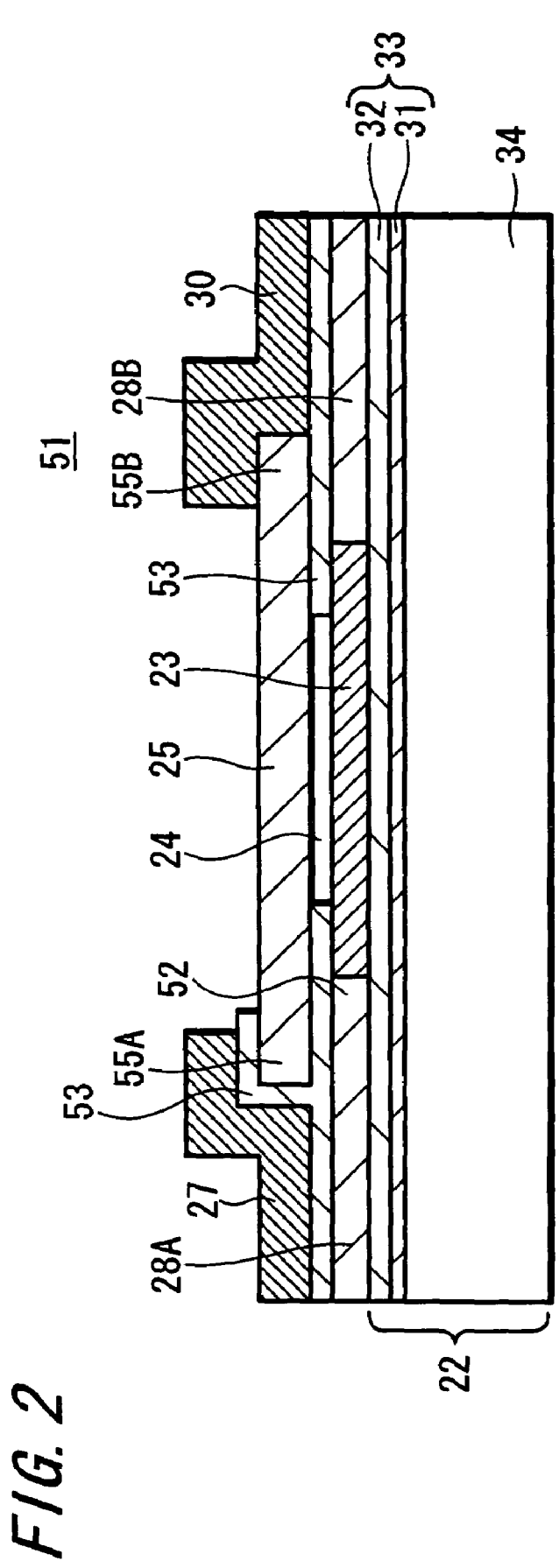
FIG. 2 is a constitutional diagram showing another embodiment of a MEMS resonator according to the present invention.

FIG. 2 shows another embodiment of a MEMS resonator according to the present invention. In a MEMS resonator 51 according to this embodiment, a substrate 22 in which an insulation film 33 is formed on a main surface of a silicon substrate 34 is used similarly to the above described embodiment, and this MEMS resonator 51 includes: an output electrode 23, a beam 25 disposed to face the output electrode 23 separated by a space, and an input electrode 27 connected to the beam 25 through a dielectric film are formed on this substrate 22.

Specifically, the output electrode 23 made of a polycrystalline silicon film, for example, is formed on the substrate 22. An insulation film of a silicon oxide film 52, for example, which is planarized to be a single surface with the output electrode 23 is formed on the substrate 22. An insulation film of a required film thickness that is a silicon nitride film 53, for example, is formed on that surface to be extended on the silicon oxide film 52 and on a part of the output electrode 23. The beam 25, which faces the output electrode 23 separated by a space 24 that is regulated by the film thickness of the silicon nitride film 53, is formed such that both ends thereof extend to make a contact on the silicon nitride film 53 which is planarized. Extension portions 55 [55A, 55B] extending to the both sides of the beam 25 become conductive layers also functioning as anchor portions. This beam 25 and the anchor portions 55 are integrally formed into a flat-plate shape, and are formed on the insulation film 53 to regulate the space 24. The input electrode 27 is formed through the dielectric film 53 on an end portion of the extension portion 55A of one side, and a wiring layer 30 is formed on an end portion of the extension portion 55B of the other side.

Figure 3:
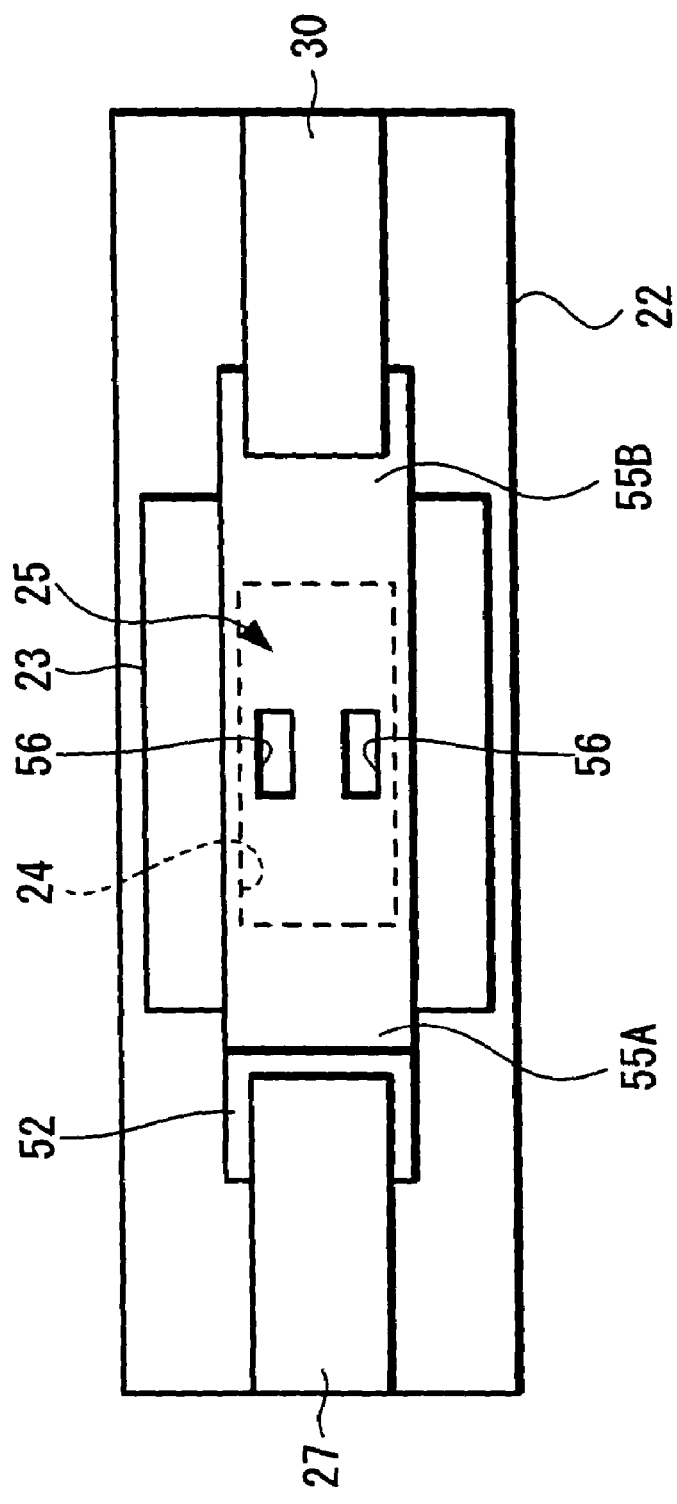
FIG. 3 is a plan view showing an example of a structure seen from an upper surface of the MEMS resonator of FIG. 2.

FIG. 3 is an example of a structure when the MEMS resonator 51 of this embodiment is seen from an upper surface. In this structure, an area enclosed by a broken line shows the actual beam 25, and the space 24 is surrounded by the silicon nitride film 53. Further, an opening 56 is formed in the beam 25 in order to remove the sacrifice layer at the time of manufacture.

Figure 4:
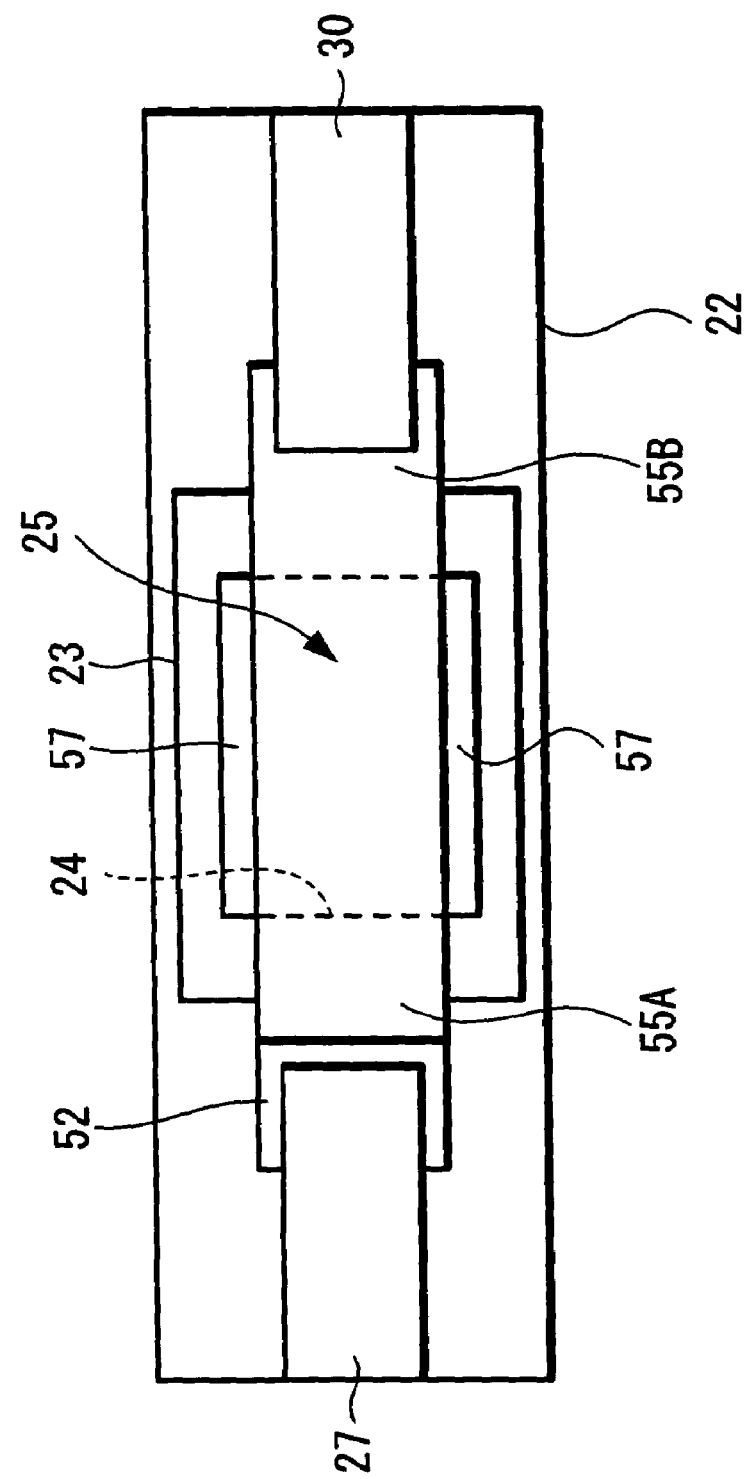
FIG. 4 is a plan view showing another example of the structure seen from the upper surface of the MEMS resonator of FIG. 2.

FIG. 4 is another example of the structure when the MEMS resonator 51 of this embodiment is seen from the upper surface. In this structure, the space 24 under the beam 25 is formed larger than the area of the actual beam 25. The sacrifice layer is removed from a side opening 57 of the space 24.

According to the MEMS resonator 51 of this embodiment, the first-order oscillation mode can be used similarly to the above-described resonator 21, and obviously the beam 25 is not brought in contact with the output electrode 23 in a higher-order oscillation mode. Therefore, there is no possibility that spike current flows in the input electrode 27 when measuring a characteristic of the resonator 51, and a possibility of damaging a peripheral device can be avoided. Further, since the input electrode 27 is connected to the beam 25 through capacitance $C01$ by the dielectric film 53, capacitance $C1=(C01 \times C02)/(C01+C02)$ which is the sum of capacitance $C01$ in the dielectric film 53 and capacitance $C02$ between the beam 25 and the output electrode 23 becomes smaller than the capacitance $C0$ between the input and output electrodes of the resonator 1 of the related art shown in the above-described FIG. 10 ($C1<C0$). Therefore, a ratio $(1/C1)/Zx$ of impedance $Z0$ of parasitic capacitance to impedance $Zx$ of a resonant system becomes large, and a similar S/N ratio of an output signal to that of the resonator 11 of FIG. 9 can be obtained.

The capacitance $C01$ can be altered by changing the film thickness and/or area of the dielectric film 53. Accordingly, an anti-resonance peak position of the beam 25 can be changed similarly to the embodiment described above, and a filter using the resonator 51 can be designed easily.

Further, the beam 25 has no bridge-shaped lateral portions (corresponding to the anchor portions) as FIG. 1, and is supported in a flat-plate state. Therefore, it is easy to obtain a high frequency in comparison to the resonator 21 of FIG. 1 since no oscillation of the lateral portion is generated.

According to the present invention, a filter can be formed using each MEMS resonator of embodiments as described above. The filter including the MEMS resonator can be used as a high frequency (RF) filter, an intermediate frequency (IF) filter and the like.

According to the present invention, a communication apparatus in which communication is performed by using an electromagnetic wave, such as a cellular phone, a wireless LAN device, a wireless transceiver, a television tuner, a radio tuner and the like including the filter of the above-described embodiments can be obtained.

Figure 8:
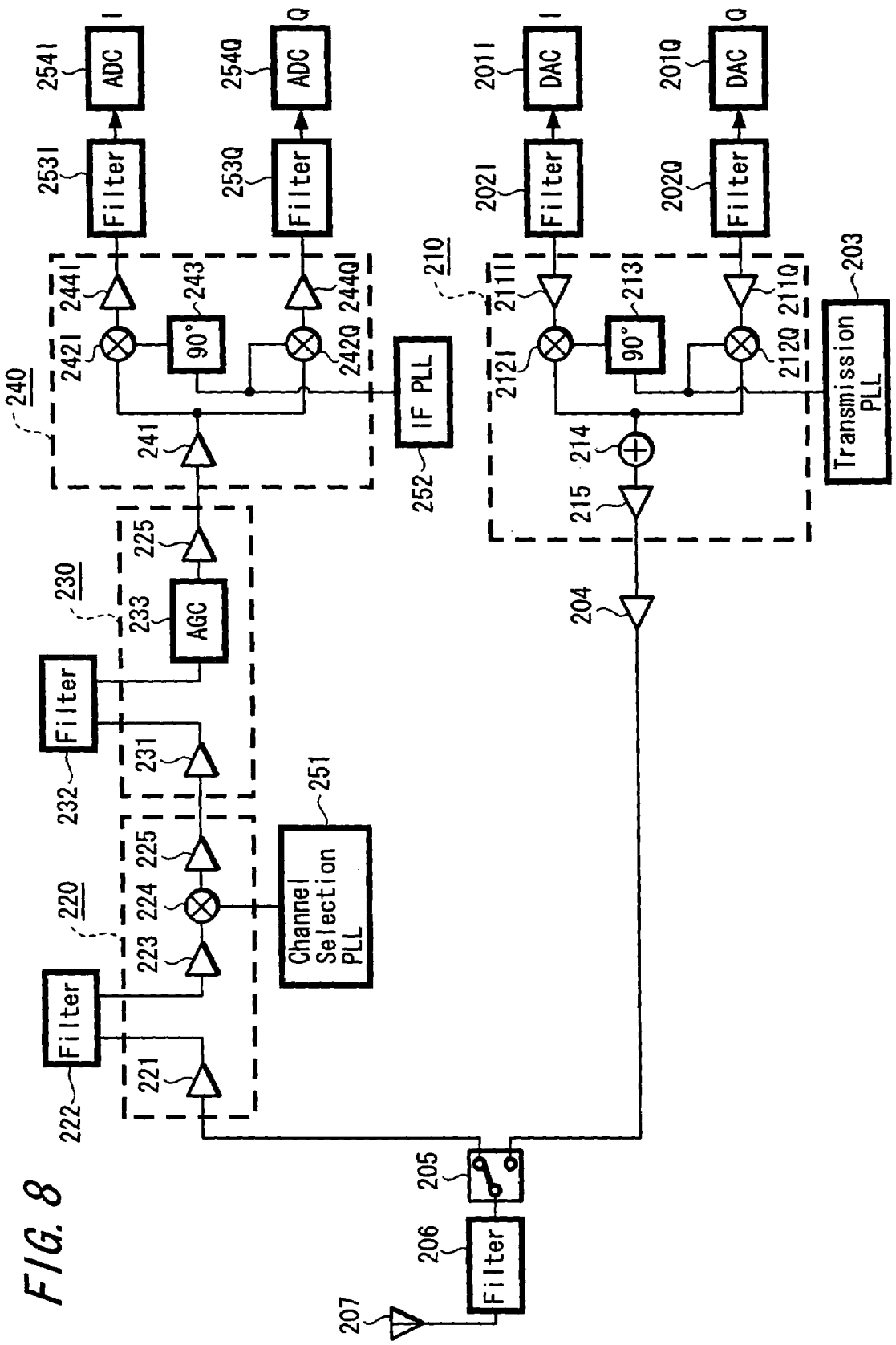
FIG. 8 is a circuit diagram showing an embodiment of a communication apparatus according to the present invention.

Next, an example of a configuration of a communication apparatus, to which the filter of the above-described embodiments of the present invention is applied, is explained by referring to FIG. 8.

First, an explanation is made regarding a configuration of a transmission system, in which transmission data of I channel and transmission data of Q channel are respectively supplied to digital/analogue converters (DAC) 201I and 201Q to be converted into analogue signals. The converted signal of each channel is supplied to band-pass filters 202I and 202Q, and outputs of the band-pass filters 202I and 202Q are supplied to a modulator 210 after a signal component other than that in the band of a transmission signal is removed.

In the modulator 210, a signal of each channel is supplied to mixers 212I and 212Q through buffer amplifiers 211I and 211Q, and is mixed and modulated with a frequency signal corresponding to a transmission frequency signal, supplied from a transmission PLL (phase-locked loop) circuit 203, and then both the mixed signals are added in an adder 214 to be made into a transmission signal of one system. In this case, a signal phase is shifted by 90° in a phase shifter 213 as to the frequency signal supplied to the mixer 212I and the signal of I channel and the signal of Q channel are orthogonally modulated.

An output of the adder 214 is supplied to a power amplifier 204 through a buffer amplifier 215, and is amplified to become predetermined transmission power. The signal amplified in the power amplifier 204 is supplied to an antenna 207 through a transmission-reception switching unit 205 and high frequency filter 206, and is wirelessly transmitted from the antenna 207. The high frequency filter 206 is a band-pass filter that removes a signal component other than that in the frequency band to transmit and receive in this communication apparatus.

As a configuration of a reception system, a signal received by the antenna 207 is supplied to a high frequency portion 220 through the high frequency filter 206 and transmission-reception switching unit 205. In the high frequency portion 220, the received signal is amplified in a low noise amplifier (LNA) 221 and after that the signal is supplied to a band-pass filter 222 to remove a signal component other than that in a reception frequency band, and the signal after this removal is supplied to a mixer 224 through a buffer amplifier 223. Further, a frequency signal supplied from a channel selection PLL circuit 251 is mixed to make a signal of a predetermined transmission channel into an intermediate frequency signal, and the intermediate frequency signal is supplied to an intermediate frequency circuit 230 through a buffer amplifier 225.

In the intermediate frequency circuit 230, the supplied intermediate frequency signal is supplied to a band-pass filter 232 through a buffer amplifier 231 to remove a signal component other than that in the band of the intermediate frequency signal, and the signal after this removal is supplied to an automatic gain control circuit (AGC circuit) 233 to be made into a signal of an almost constant gain. The intermediate frequency signal whose gain is adjusted in the automatic gain control circuit 233 is supplied to a demodulator 240 through a buffer amplifier 234.

In the demodulator 240, the supplied intermediate frequency signal is supplied to mixers 242I and 242Q through a buffer amplifier 241 to be mixed with a frequency signal supplied from an intermediate frequency PLL circuit 252, and the received signal component of I channel and signal component of Q channel are demodulated. In this case, a frequency signal whose signal phase is shifted by 90° in a phase shifter 243 is supplied to the mixer 242I for I signal to demodulate the orthogonally modulated signal component of I channel and signal component of Q channel.

The demodulated signals of I channel and Q channel are supplied respectively to band-pass filters 253I and 253Q through buffer amplifiers 244I and 244Q to remove a signal component other than the signals of I channel and Q channel, and the signals after this removal are supplied to analogue/digital converters (ADC) 254I and 254Q to be converted into digital data through sampling, so that reception data of I channel and reception data of Q channel are obtained.

In the configuration explained above, the band-limiting can be performed by applying the filter having the above-described configuration of the embodiment to part of or all of the band-pass filters 202I, 202Q, 206, 222, 232, 253I, and 253Q.

According to the communication apparatus of this embodiment, since a filter including the MEMS resonator of the above-described embodiment of the present invention is used as the filter, there is no possibility in the filter that the beam is in contact with the output electrode of the lower electrode at the time of operation and there occurs no defect that spike current flows through the filter and damages a peripheral device. Accordingly, a highly reliable communication apparatus can be provided.

In the example of FIG. 8, although each filter is formed as a band-pass filter, the filter may be formed as a low pas filter that passes only a frequency band lower than a predetermined frequency and as a high pass filter that passes only a frequency band higher than a predetermined frequency, and each filter having the above-described configuration according to the embodiments of the present invention may be applied to those filters. In addition, although the example of FIG. 8 is the communication apparatus that performs the wireless transmission and wireless reception, the present invention can be applied to a filter included in a communication apparatus that performs transmission and reception through a wired transmission path, and furthermore it is also possible to apply the filter of the configuration of the above-described embodiments to a filter included in a communication apparatus that performs only transmission processing and in a communication apparatus that performs only reception processing.

The invention claimed is:

1. A Micro Electro Mechanical System ("MEMS") resonator comprising:
   an output electrode on a surface of a substrate;
   a beam capable of oscillating disposed above the output electrode;
   a conductive layer on the outside of the output electrode on the substrate; and
   an input electrode juxtaposed to the beam and above a dielectric layer,
   wherein,
      both ends of the beam are supported by anchor portions formed in the conductive layer such that the beam is connected to the conductive layer,
      the input electrode is connected to the conductive layer by the dielectric layer, and
      the beam is electrically separated from the input electrode and the output electrode.

2. A MEMS resonator comprising:
   an output electrode formed on the surface of a substrate;
   a beam capable of oscillating disposed above the output electrode, the beam being separated from the output electrode; and
   an input electrode juxtaposed to the beam and above a dielectric layer,
   wherein,
   said input electrode is connected to said beam through a dielectric layer, and
   the beam is configured to receive a voltage applied to said beam.

3. A MEMS resonator according to claim 2, wherein said beam and extension portions from the beam are integrally formed into a flat-plate shape, and
   said beam is supported at said extension portions.

4. A filter comprising a MEMS resonator which includes:
   an output electrode on the surface of a substrate;
   a beam capable of oscillating disposed above the output electrode; and
   an input electrode juxtaposed to the beam and above a dielectric layer,
   wherein,
   said output electrode and input electrode are electrically separated from said beam.

5. A filter comprising a MEMS resonator which includes:
   an output electrode on the surface of a substrate;
   a beam capable of oscillating disposed above the output electrode, the beam being separated from the output electrode; and
   an input electrode juxtaposed to the beam and above a dielectric layer,
   wherein,
   said input electrode is connected to said beam through the dielectric layer, and a voltage is applied to said beam.

6. A filter according to claim 5, wherein
   said beam and extension portions from the beam are integrally formed into a flat-plate shape, and
   said beam is supported at said extension portions.

7. A method of manufacturing a MEMS resonator, comprising the steps of:
   forming an input-side beam capable of oscillating above an output electrode formed on a substrate through a sacrifice layer and forming a dielectric film on one fixed end of said beam;
   selectively removing said sacrifice layer; and
   forming an Al-based input electrode on said dielectric film.

8. A communication apparatus including a filter to limit a band of a transmission signal and/or reception signal, comprising as said filter:
- a filter that includes a MEMS resonator with an output electrode;
- a beam capable of oscillating disposed above the output electrode; and
- an input electrode juxtaposed to the beam and above a dielectric layer,
- wherein,
  - said output electrode and input electrode are separated from said beam.

9. A communication apparatus including a filter to limit a band of a transmission signal and/or reception signal, comprising as said filter:
- a filter that includes a MEMS resonator which has an output electrode;
- a beam capable of oscillating disposed above the output electrode, the beam being separate from the output electrode; and
- an input electrode juxtaposed to the beam and above a dielectric layer,
- wherein,
  - said input electrode is connected to said beam through a dielectric film and a required voltage is applied to said beam.

10. A communication apparatus according to claim 9, wherein
- said beam and extension portions from said beam are integrally formed into a flat-plate shape in said filter, and
- said beam is supported at said extension portions.

* * * * *